United States Patent
Dai et al.

(10) Patent No.: US 9,460,676 B2
(45) Date of Patent: Oct. 4, 2016

(54) GOA CIRCUIT AND LIQUID CRYSTAL DISPLAY DEVICE APPLIED TO LIQUID CRYSTAL DISPLAYS

(71) Applicant: SHENZHEN CHINA STAR OPTOELECTRONICS TECHNOLOGY CO., LTD., Shenzhen, Guangdong (CN)

(72) Inventors: Chao Dai, Shenzhen (CN); Tzu-Chieh Lai, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 48 days.

(21) Appl. No.: 14/417,248

(22) PCT Filed: Nov. 27, 2014

(86) PCT No.: PCT/CN2014/092326
§ 371 (c)(1),
(2) Date: Jan. 26, 2015

(87) PCT Pub. No.: WO2016/074283
PCT Pub. Date: May 19, 2016

(65) Prior Publication Data
US 2016/0140922 A1   May 19, 2016

(30) Foreign Application Priority Data

Nov. 13, 2014  (CN) .......................... 2014 1 0639701

(51) Int. Cl.
G09G 3/36         (2006.01)
(52) U.S. Cl.
CPC .......... *G09G 3/3648* (2013.01); *G09G 3/3677* (2013.01); *G09G 3/3696* (2013.01); *G09G 2300/0871* (2013.01); *G09G 2310/0286* (2013.01)

(58) Field of Classification Search
CPC ............ G09G 3/3266; G09G 3/3611–3/3696; G09G 2310/02–2310/0221; G09G 2310/0262; G09G 2310/0264–2310/0297
USPC ........................................................ 345/100
See application file for complete search history.

(56) References Cited

U.S. PATENT DOCUMENTS

2011/0142192 A1*  6/2011  Lin ...................... G09G 3/3677
                                                                    377/77
2012/0162187 A1   6/2012  Lee et al.
(Continued)

FOREIGN PATENT DOCUMENTS

CN    102982777 A    3/2013
CN    103426414 A    12/2013
(Continued)

*Primary Examiner* — Sanghyuk Park

(57) ABSTRACT

A GOA circuit applied to a liquid crystal display is disclosed, which comprises a plurality of cascaded shift register units, an (N)th level shift register unit is controlled to charge an (N)th level scanning line accordingly. The (N)th level shift register unit includes a pull-up circuit, a pull-down circuit, a pull-down sustain circuit, a pull-up control circuit, a down transfer circuit, and an bootstrap capacitor, and a display device is also disclosed herein. By replacing scanning lines with a constant voltage VDD or two voltages to accomplish the function of down transfer, the loading of scanning lines and the risk which comes with wiring step-by-step are decreased, forward-scanning operation and backward-scanning operation are accomplished accordingly.

18 Claims, 5 Drawing Sheets

(56) References Cited

U.S. PATENT DOCUMENTS

| | | | |
|---|---|---|---|
| 2013/0321499 A1* | 12/2013 | Park | G09G 3/3611 345/698 |
| 2014/0103983 A1 | 4/2014 | Chang et al. | |
| 2014/0159999 A1 | 6/2014 | Gu et al. | |
| 2015/0002504 A1* | 1/2015 | Jo | G09G 3/3677 345/213 |
| 2016/0049126 A1 | 2/2016 | Zhang et al. | |

FOREIGN PATENT DOCUMENTS

| | | |
|---|---|---|
| CN | 104008741 A | 8/2014 |
| CN | 104008742 A | 8/2014 |
| CN | 104036738 A | 9/2014 |
| KR | 20120072465 A | 7/2012 |

* cited by examiner

GOA CIRCUIT AND LIQUID CRYSTAL DISPLAY DEVICE APPLIED TO LIQUID CRYSTAL DISPLAYS

BACKGROUND OF THE INVENTION

1. Field of Invention

The present invention relates to the field of liquid crystal display technology, and more particularly to a liquid crystal display for a GOA (Gate Driver on Array, an array substrate row driver) circuit and a display device.

2. Description of Prior Art

In an active liquid crystal display, each pixel has a thin film transistor (TFT), and its gate (Gate) is connected to the horizontal scanning line, a drain (Drain) is connected to the data line, and the source (Source) is connected to the pixel electrode. Applying a sufficient voltage to the scanning line, so that all the TFTs on the scanning line will open, the display signal voltage of the data line is written into the pixel electrode through the TFT, thereby controlling different LCD transmittance and thus controlling the color effect.

At present, the scanning lines of the active liquid crystal display panel are driven by external ICs (integrated chips) connected with the active liquid crystal display panel. The external ICs are configured to control the stepwise charge of each level of the scanning lines and discharge of each level of the scanning lines.

In the GOA technique, namely Gate Driver on Array (array substrate row driver) technology, the driving circuit of the scanning lines can be formed on the panel around an area of the display area by using the original LCD panel manufacturing process, so that the GOA technique can accomplish the driving of the scanning lines by replacing the external ICs. The GOA technique can reduce the binding process of external ICs, and might improve productivity and reduce production costs; it also makes the LCD panel be more suitable for production with narrow borders or even no borders around the display products.

Existing GOA circuits generally include a plurality of shift register units, each shift register unit corresponding to drive a scanning line. The shift register unit includes a pull-up circuit (Pull-up part), a pull-up control circuit (Pull-up control part), a down transfer circuit (Transfer Part), a pull-down circuit (Key Pull-down Part) and a pull-down sustain circuit (Pull-down Holding Part), and a bootstrap (Boast) capacitor is responsible for raising potential. The Pull-up circuit is mainly responsible for making the clock signal (Clock) to output as a gate (Gate) signal; a pull-up control circuit is configured to control the opening time of the pull-up circuit, and is usually connected to a downstream signal or a Gate signal of a previous level of shift register; the pull-down circuit is responsible for pulling the Gate signal down to low potential firstly, in other words, when the Gate signal is closed; the pull-down circuit is further responsible for holding the output signal of the Gate and Gate signal point of the pull-up circuit (usually called Q point) in the closed state (negative potential). There are usually two drop maintain modules working alternatively; the bootstrap capacitor (C boast) is responsible for secondary lifting of Q point, it is a good to an output of G(N) of the pull-up circuit.

FIG. 1 is a circuit diagram of a GOA circuit of a prior art. A shift register comprises a pull-up control circuit 100, a pull-up circuit 200, a downstream circuit 300, a pull-down circuit 400, a bootstrap capacitor 500, a first pull-down sustain circuit 600, a second pull-down sustain circuit 700, and a bridge circuit 800. The first pull-down sustain circuit 600, the second pull-down sustain circuit 700, and the bridge circuit 800 constitute a design of 3-stages of a resistance voltage division.

The bridge circuit 800 is responsible for adjusting the potentials of P(N) and K(N) mainly by TFT T55. A gate of the TFT T55 couples with Q(N), a drain of the TFT T55 couples with P(N), and a source of the TFT T55 couples with K(N). During operation, the gate of TFT T55 is open to make the potentials of P(N) and K(N) similar and under a close state. The low potentials of low frequency signals LC1 and LC2 are less than VSS, which adjusts the potentials of P(N) and K(N) to be less than VSS during operation and make sure that Vgs of TFTs T32, T33 used to pull down G(N) point and Vgs of TFTs T42, T43 used to pull down Q(N) are less than 0 volts, which has a better performance to prevent the current leakage of G(N) and Q(N).

The first pull-down sustain circuit 600 and the second pull-sown sustain circuit 700 are based on a symmetric design, which accomplishes the functions below: first, during operation, the first pull-down sustain circuit 600 (or the second pull-sown sustain circuit 700) serves as a big-resistance and is in a close state, the second pull-sown sustain circuit 700 (or the first pull-down sustain circuit 600) serves as a small-resistance and is in an open state, and the bridge circuit 800 serves as a small-resistance and is in the open state to make P(N) and K(N) in a low potential state, and ensures the lifting of Q(N) and the output of G(N); second, during non-operation, both the first pull-down sustain circuit 600 and the second pull-sown sustain circuit 700 serve as small-resistances and are in the open state and the bridge circuit 800 serves as large resistance and is in the close state to accomplish the high and low potentials and alternation of P(N) and K(N). A gate of a TFT T54 couples with LC2, a drain of the TFT T54 couples with LC2, and a source of the TFT T54 couples with P(N). A gate of a TFT T64 couples with LC1, a drain of the TFT T64 couples with LC2, and a source of the TFT T64 couples with L(N). The TFTs T54, T64 are called balanced TFTs, which are used to adjust the resistance voltage division and a rapid discharge while switching signals. A gate of a TFT T52 couples with Q(N), a drain of the TFT T52 couples with S(N), and a source of the TFT T52 couples with VSS. A gate of a TFT T62 couples with Q(N), a drain of the TFT T62 couples with T(N), and a source of the TFT T62 couples with VSS. The TFTs T52, T62 are used to pull down S(N) and T(N) during operation.

By using the shift register unit applied to the 3-stages resistance voltage division, which is constituted by the first pull-down sustain circuit 600, the second pull-down sustain circuit 700, and the bridge circuit 800, high temperature stability and long-time operation reliability of the pull-down sustain circuit are increased, the switch of P(N) and K(N) is accomplished by using a low frequency signal, and the electricity leakage of G(N) and Q(N) is reduced as low as possible by pull down of the potentials of P(N) and K(N) to during operation. During non-operation, one of P(N) and K(N) is closed to the low potential of LC at a low potential, because the low potential of LC is lower than VSS, the TFTs T32/T42 or the TFTs T33/T43 are in a negative potential recovery state with half of the time needed to control the potential of the negative potential by adjusting the low potential pf the low frequency signal, and a risk of malfunction of the pull-down sustain circuit is effectively decreased.

However, the existing GOA circuits have mainly adopted a theory of shift registers; a transmission of stepwise signals generally accomplishes down transfer by the scanning line G(N), a loading of scanning line G(N) increases, wiring is complicated, and a risk of disconnection exists.

Furthermore, the conventional GOA circuits are designed for a one-direction scanning, with a two-directions scanning being impossible.

SUMMARY OF THE INVENTION

An objective of the present invention is to provide a GOA circuit and a liquid crystal display device applied to a liquid crystal display. By replacing scanning lines G(N) with a constant voltage VDD to accomplish the function of down transfer, and a down transfer module being additionally disposed to match the constant voltage, the purpose of a transfer of sequential step-by-step signals is achieved. Then, since the scanning line G(N) is only responsible for driving a scanning line, the loading of scanning line G(N) and the risk which comes with wiring step-by-step are decreased, a charge capacity of the gate signal point Q(N) during operation is reinforced, and a potential of the gate signal point Q(N) is reinforced by adjusting the potential of the constant voltage VDD. A forward-scanning operation and a backward-scanning operation are accomplished by two voltages VF, VR; forward-scanning operation and backward-scanning operation of a GOA circuit is accomplished accordingly.

To achieve the above objective, the present invention provides a GOA circuit applied to liquid crystal display. The GOA circuit comprises a plurality of cascaded shift register units, an (N)th level shift register unit is controlled to charge an (N)th level scanning line accordingly. The (N)th level shift register unit includes a pull-up circuit, a pull-down circuit, a pull-down sustain circuit, a pull-up control circuit, a down transfer circuit, and an bootstrap capacitor.

The pull-up circuit, the pull-down sustain circuit, and the bootstrap capacitor are individually connected with a gate signal point and the Nth level scanning line.

The pull-up control circuit and the down transfer circuit are individually connected with the gate signal point.

The pull-down circuit is connected with a start signal of an (N+1)th level shift register.

The pull-up control circuit is connected with a start signal of an (N−1)th level shift register.

The pull-down sustain circuit comprises:

A first TFT, a gate of the first TFT is connected with a first circuit point, a drain of the first TFT is connected with the (N)th level scanning line, and a source of the first TFT is connected with a first direct-current voltage.

A second TFT, a gate of the second TFT is connected with the first circuit point, a drain of the second TFT is connected with the gate signal point, and a source of the second TFT is connected with a second direct-current voltage.

A third TFT, a gate of the third TFT is connected with the gate signal point, a drain of the third TFT is connected with a source signal point, and a source of the third TFT is connected with the first direct-current voltage.

A fourth TFT, and a source of the fourth TFT is connected with a source signal point, a gate and a drain of the fourth TFT are connected with a first clock signal.

A fifth TFT, a gate of the fifth TFT is connected with the source signal point, a drain of the fifth TFT is connected with the first clock signal, and a source of the fifth TFT is connected with the first circuit point.

A gate of a sixth TFT is connected with a second clock signal, a drain of the sixth TFT is connected with the first clock signal, and a source of the sixth TFT is connected with the first circuit point.

A gate of a seventh TFT is connected with the first circuit point, a drain of the seventh TFT is connected with a start signal of an (N)th level shift register, and a source of the seventh TFT is connected with the second direct-current voltage.

A gate of an eighth TFT is connected with a second circuit point, a drain of the eighth TFT is connected with the (N)th level scanning line, and a source of the eighth TFT is connected with the first direct-current voltage.

A gate of the ninth TFT is connected with the second circuit point, a drain of the ninth TFT is connected with the gate signal point, and a source of the ninth TFT is connected with the second direct-current voltage.

A gate of the tenth TFT is connected with the gate signal point, a drain of the tenth TFT is connected with a drain signal point, and a source of the tenth TFT is connected with the first direct-current voltage.

A source of the eleventh TFT is connected with the drain signal point, a gate and a drain of the eleventh TFT are connected with the second clock signal.

A gate of the twelfth TFT is connected with the drain signal point, a drain of the twelfth TFT is connected with the second clock signal, and a source of the twelfth TFT is connected with the second circuit point.

A gate of the thirteenth TFT is connected with the first clock signal, a drain of the thirteenth TFT is connected with the second clock signal, and a source of the thirteenth TFT is connected with the second circuit point.

A gate of the fourteenth TFT is connected with the second circuit point, a drain of the fourteenth TFT is connected with the start signal of an (N)th level shift register, and a source of the fourteenth TFT is connected with the second direct-current voltage.

A gate of the fifteenth TFT is connected with the gate signal point, a drain of the fifteenth TFT is connected with the first circuit point, and a source of the fifteenth TFT is connected with the second circuit point.

While in operation, frequencies of the first clock signal and the second clock signal are lower than that of an (N) level clock signal (CK(N)), a process of charging the first circuit point by the first clock signal and a process of charging the second circuit point by the second clock signal are performed alternatingly. The pull-up circuit comprises a sixteenth TFT, a gate of the sixteenth TFT is connected with the gate signal point, a drain of the sixteenth TFT is connected with the (N) level clock signal, and a source of the sixteenth TFT is connected with the (N)th level scanning line.

In one embodiment, the pull-down circuit comprises:

A seventeenth TFT, a gate of the seventeenth TFT is connected with the start signal of an (N+1)th level shift register, a drain of the seventeenth TFT is connected with the gate signal point, and a source of the seventeenth TFT is connected with the second direct-current voltage.

In one embodiment, the down transfer circuit comprises:

An eighteenth TFT, a gate of the eighteenth TFT is connected with the gate signal point, a drain of the eighteenth TFT is connected with the (N) level clock signal, and a source of the eighteenth TFT is connected with the start signal of an (N)th level shift register.

In one embodiment, the pull-up control circuit comprises:

a nineteenth TFT, a gate of the nineteenth TFT is connected with the start signal of an (N−1)th level shift register, a drain of the nineteenth TFT is connected with a constant voltage, and a source of the nineteenth TFT is connected with the gate signal point.

In one embodiment, the pull-up control circuit comprises:

A nineteenth TFT, a gate of the nineteenth TFT is connected with the start signal of an (N−1)th level shift register, a drain of the nineteenth TFT is connected with a forward voltage, and a source of the nineteenth TFT is connected with the gate signal point.

In one embodiment, the pull-down circuit comprises:

A seventeenth TFT (T41), a gate of the seventeenth TFT is connected with the start signal of an (N+1)th level shift register, a drain of the seventeenth TFT is connected with the gate signal point, and a source of the seventeenth TFT is connected with a backward voltage.

In one embodiment, a duty ration of the (N) level clock signal is less than 50 percent.

In one embodiment, the second direct-current voltage is less than the first direct-current voltage.

To achieve the above objective, the present invention provides another GOA circuit applied to liquid crystal display. The GOA circuit comprises a plurality of cascaded shift register units, an (N)th level shift register unit is controlled to charge an (N)th level scanning line accordingly. The (N)th level shift register unit includes a pull-up circuit, a pull-down circuit, a pull-down sustain circuit, a pull-up control circuit, a down transfer circuit, and an bootstrap capacitor.

The pull-up circuit, the pull-down sustain circuit, and the bootstrap capacitor are individually connected with a gate signal point and the Nth level scanning line.

The pull-up control circuit and the down transfer circuit are individually connected with the gate signal point.

The pull-down circuit is connected with a start signal of an (N+1)th level shift register.

The pull-up control circuit is connected with a start signal of an (N−1)th level shift register.

The pull-down sustain circuit comprises:

A first TFT, a gate of the first TFT is connected with a first circuit point, a drain of the first TFT is connected with the (N)th level scanning line, and a source of the first TFT is connected with a first direct-current voltage.

A second TFT, a gate of the second TFT is connected with the first circuit point, a drain of the second TFT is connected with the gate signal point, and a source of the second TFT is connected with a second direct-current voltage.

A third TFT, a gate of the third TFT is connected with the gate signal point, a drain of the third TFT is connected with a source signal point, and a source of the third TFT is connected with the first direct-current voltage.

A fourth TFT, and a source of the fourth TFT is connected with a source signal point, a gate and a drain of the fourth TFT are connected with a first clock signal.

A fifth TFT, a gate of the fifth TFT is connected with the source signal point, a drain of the fifth TFT is connected with the first clock signal, and a source of the fifth TFT is connected with the first circuit point.

A sixth TFT, a gate of the sixth TFT is connected with a second clock signal, a drain of the sixth TFT is connected with the first clock signal, and a source of the sixth TFT is connected with the first circuit point.

A seventh TFT, a gate of the seventh TFT is connected with the first circuit point, a drain of the seventh TFT is connected with a start signal of an (N)th level shift register, and a source of the seventh TFT is connected with the second direct-current voltage.

An eighth TFT, a gate of the eighth TFT is connected with a second circuit point, a drain of the eighth TFT is connected with the (N)th level scanning line, and a source of the eighth TFT is connected with the first direct-current voltage.

A ninth TFT, a gate of the ninth TFT is connected with the second circuit point, a drain of the ninth TFT is connected with the gate signal point, and a source of the ninth TFT is connected with the second direct-current voltage.

A tenth TFT, a gate of the tenth TFT is connected with the gate signal point, a drain of the tenth TFT is connected with a drain signal point, and a source of the tenth TFT is connected with the first direct-current voltage.

An eleventh TFT, and a source of the eleventh TFT is connected with the drain signal point; a gate and a drain of the eleventh TFT are connected with the second clock signal.

A twelfth TFT, a gate of the twelfth TFT is connected with the drain signal point, a drain of the twelfth TFT is connected with the second clock signal, and a source of the twelfth TFT is connected with the second circuit point.

A thirteenth TFT, a gate of the thirteenth TFT is connected with the first clock signal, a drain of the thirteenth TFT is connected with the second clock signal, and a source of the thirteenth TFT is connected with the second circuit point.

A fourteenth TFT, a gate of the fourteenth TFT is connected with the second circuit point, a drain of the fourteenth TFT is connected with the start signal of an (N)th level shift register, and a source of the fourteenth TFT is connected with the second direct-current voltage.

A fifteenth TFT, a gate of the fifteenth TFT is connected with the gate signal point, a drain of the fifteenth TFT is connected with the first circuit point, and a source of the fifteenth TFT is connected with the second circuit point.

While in operation, frequencies of the first clock signal and the second clock signal are lower than that of an (N) level clock signal (CK(N)), a process of charging the first circuit point by the first clock signal and a process of charging the second circuit point by the second clock signal are performed alternatingly.

The pull-up circuit comprises:

A gate of the sixteenth TFT is connected with the gate signal point, a drain of the sixteenth TFT is connected with the (N) level clock signal, and a source of the sixteenth TFT is connected with the (N)th level scanning line.

The pull-down circuit comprises:

A seventeenth TFT, a gate of the seventeenth TFT is connected with the start signal of an (N+1)th level shift register, a drain of the seventeenth TFT is connected with the gate signal point, and a source of the seventeenth TFT is connected with the second direct-current voltage.

In one embodiment, the down transfer circuit comprises:

An eighteenth TFT, a gate of the eighteenth TFT is connected with the gate signal point, a drain of the eighteenth TFT is connected with the (N) level clock signal, and a source of the eighteenth TFT is connected with the start signal of an (N)th level shift register.

In one embodiment, the pull-up control circuit comprises:

a nineteenth TFT, a gate of the nineteenth TFT is connected with the start signal of an (N−1)th level shift register, a drain of the nineteenth TFT is connected with a constant voltage, and a source of the nineteenth TFT is connected with the gate signal point.

In one embodiment, the pull-up control circuit comprises:

A nineteenth TFT, a gate of the nineteenth TFT is connected with the start signal of an (N−1)th level shift register, a drain of the nineteenth TFT is connected with a forward voltage, and a source of the nineteenth TFT is connected with the gate signal point.

In one embodiment, the pull-down circuit comprises:

A seventeenth TFT (T41), a gate of the seventeenth TFT is connected with the start signal of an (N+1)th level shift register, a drain of the seventeenth TFT is connected with the gate signal point, and a source of the seventeenth TFT is connected with a backward voltage.

In one embodiment, a duty ration of the (N) level clock signal is less than 50 percent.

In one embodiment, the second direct-current voltage is less than the first direct-current voltage.

Accordingly, the present invention also provides a display device. The display device comprises the GOA circuit applied to the liquid crystal display mentioned before.

With the above technical proposal, the beneficial effects are as below:

By replacing scanning lines G(N) with a constant voltage VDD to accomplish the function of down transfer, and a down transfer module being additionally disposed to match the constant voltage, the purpose of a transfer of step-by-step signals is achieved. Since the scanning line G(N) is only responsible for driving a scanning line, the loading of scanning line G(N) and the risk which comes with wiring step-by-step are decreased, a charge capacity of the gate signal point Q(N) during operation is reinforced, and a potential of the gate signal point Q(N) is reinforced by adjusting the potential of VDD. A positive direction scanning and an opposite direction scanning are accomplished by two signals VF, VR; the positive and opposite directions scanning of a GOA circuit is accomplished accordingly.

DETAILED DESCRIPTION OF THE PREFERRED EMBODIMENTS

Figure 1:
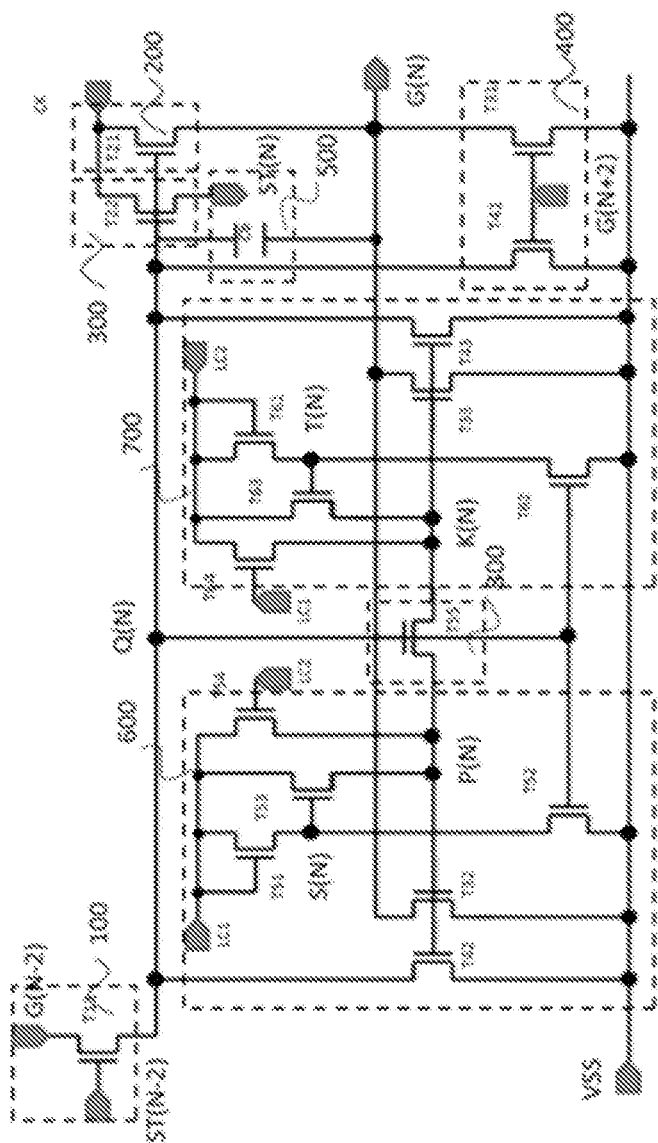
FIG. 1 is a circuit diagram of a conventional GOA circuit.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, units with similar structures are marked with the same labels.

Figure 2:
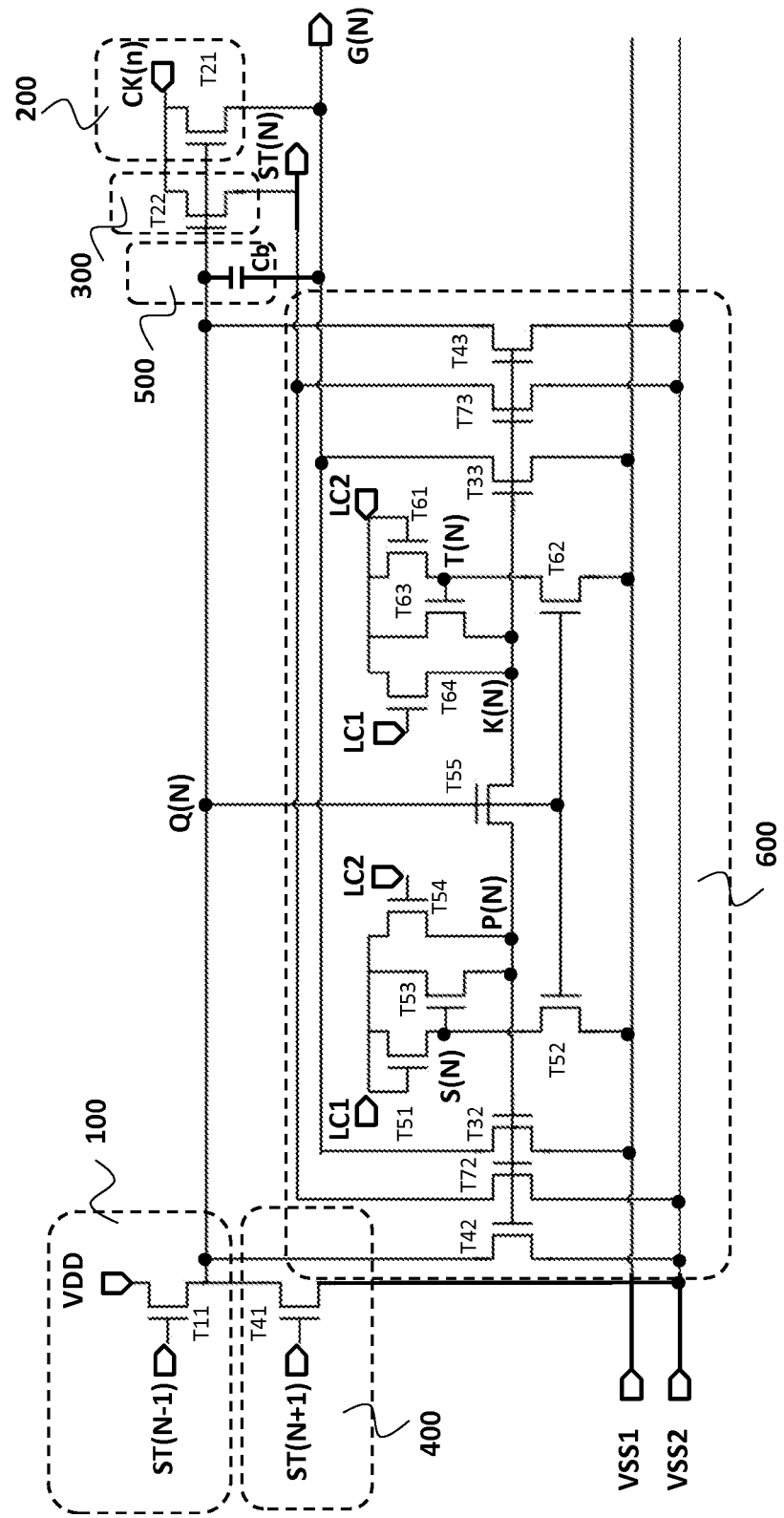
FIG. 2 is a circuit diagram of a GOA circuit according to a first embodiment of the present invention.

FIG. 2 is a circuit diagram of a GOA circuit of a first embodiment of the present invention. In the first embodiment, the GOA circuit comprises a plurality of cascaded shift register units, an (N)th level shift register unit is controlled to charge an (N)th level scanning line G(N) accordingly. The (N)th level shift register unit includes a pull-up circuit 200, a pull-down circuit 400, a pull-down sustain circuit 600, a pull-up control circuit 100, a down transfer circuit 300, and a bootstrap capacitor Cb. The pull-up circuit 200, the pull-down sustain circuit 600, and the bootstrap capacitor Cb are individually connected with a gate signal point Q(N) and the Nth level scanning line G(N). The pull-up control circuit 100 and the down transfer circuit 300 are individually connected with the gate signal point Q(N). The pull-down circuit 400 is connected with a start signal ST(N+1) of an (N+1)th level shift register. The pull-up control circuit 100 is connected with a start signal ST(N−1) of an (N−1)th level shift register.

The pull-down sustain circuit 600 comprises:

A first thin film transistor (TFT) T32 comprises a gate connected with a first circuit point P(N), a drain connected with the (N)th level scanning line G(N), and a source connected with a first direct-current voltage VSS1.

A second TFT T42 comprises a gate connected with the first circuit point P(N), a drain connected with the gate signal point Q(N), and a source connected with a second direct-current voltage VSS2.

A third TFT T52 comprises a gate connected with the gate signal point Q(N), a drain connected with a source signal point S(N), and a source connected with the first direct-current voltage VSS1.

A fourth TFT T51 comprises and a source connected with a source signal point S(N), a gate and a drain connected with a first clock signal LC1.

A fifth TFT T53 comprises a gate of the fifth TFT T53 is connected with the source signal point S(N), a drain of the fifth TFT T53 is connected with the first clock signal LC1, and a source of the fifth TFT T53 is connected with the first circuit point P(N).

A sixth TFT T54 comprises a gate of the sixth TFT T54 is connected with a second clock signal LC2, a drain of the sixth TFT T54 is connected with the first clock signal LC1, and a source of the sixth TFT T54 is connected with the first circuit point P(N).

A seventh TFT T72 comprises a gate of the seventh TFT T72 is connected with the first circuit point P(N), a drain of the seventh TFT T72 is connected with a start signal ST(N) of an (N)th level shift register, and a source of the seventh TFT T72 is connected with the second direct-current voltage VSS2.

An eighth TFT T33 comprises a gate of the eighth TFT T33 is connected with a second circuit point K(N), a drain of the eighth TFT T33 is connected with the (N)th level scanning line G(N), and a source of the eighth TFT T33 is connected with the first direct-current voltage VSS1.

A ninth TFT T43 comprises a gate connected with the second circuit point K(N), a drain connected with the gate signal point Q(N), and a source connected with the second direct-current voltage VSS2.

A tenth TFT T62 comprises a gate connected with the gate signal point Q(N), a drain connected with a drain signal point T(N), and a source connected with the first direct-current voltage VSS1.

An eleventh TFT T61 comprises a source connected with the drain signal point T(N), a gate and a drain are connected with the second clock signal LC2.

A twelfth TFT T63 comprises a gate connected with the drain signal point T(N), a drain connected with the second clock signal LC2, and a source connected with the second circuit point K(N).

A thirteenth TFT T64 comprises a gate connected with the first clock signal LC1, a drain connected with the second clock signal LC2, and a source connected with the second circuit point K(N).

A fourteenth TFT T73 comprises a gate connected with the second circuit point K(N), a drain connected with the start signal ST(N) of an (N)th level shift register, and a source connected with the second direct-current voltage VSS2.

A fifteenth TFT T55 comprises a gate of the fifteenth TFT T55 is connected with the gate signal point Q(N), a drain of the fifteenth TFT T55 is connected with the first circuit point P(N), and a source of the fifteenth TFT T55 is connected with the second circuit point K(N).

While in operation, frequencies of the first clock signal LC1 and the second clock signal LC2 are lower than that of an (N) level clock signal CK(N). A process of charging the first circuit point P(N) by the first clock signal LC1 and a process of charging the second circuit point K(N) by the second clock signal LC2 are performed alternatingly.

Practically, the pull-up circuit 200 comprises a sixteenth TFT T21. A gate of the sixteenth TFT T21 is connected with the gate signal point Q(N), a drain of the sixteenth TFT T21 is connected with the (N) level clock signal CK(N), and a source of the sixteenth TFT T21 is connected with the (N)th level scanning line G(N).

The pull-down circuit 400 comprises a seventeenth TFT T41. A gate of the seventeenth TFT T41 is connected with the start signal ST(N+1) of an (N+1)th level shift register, a drain of the seventeenth TFT T41 is connected with the gate signal point Q(N), and a source of the seventeenth TFT T41 is connected with the second direct-current voltage VSS2.

The down transfer circuit 300 comprises an eighteenth TFT T22. A gate of the eighteenth TFT T22 is connected with the gate signal point Q(N), a drain of the eighteenth TFT T22 is connected with the (N) level clock signal CK(N), and a source of the eighteenth TFT T22 is connected with the start signal ST(N) of an (N)th level shift register.

The pull-up control circuit 100 comprises an nineteenth TFT T11. A gate of the nineteenth TFT T11 is connected with the start signal ST(N-1) of an (N-1)th level shift register, a drain of the nineteenth TFT T11 is connected with a constant voltage VDD, and a source of the nineteenth TFT T11 is connected with the gate signal point Q(N).

In the first embodiment, by replacing scanning line G(N) with constant voltage VDD to accomplish the function of down transfer, and a down transfer module being additionally disposed to match the constant voltage, the purpose of a transfer of sequential signals is achieved. Since the scanning line G(N) is only responsible for driving a scanning line, the loading of scanning line G(N) and the risk which comes with wiring are decreased, a capacity of charge of the gate signal point Q(N) during operation is reinforced, and a potential of the gate signal point Q(N) is reinforced by adjusting the potential of VDD.

Figure 3:
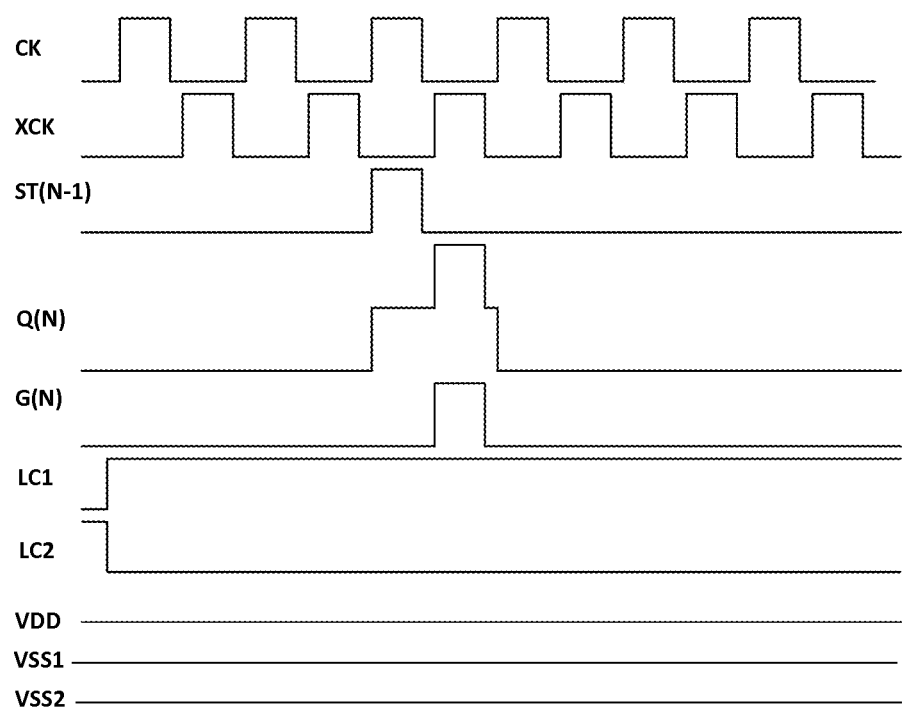
FIG. 3 is a pulse diagram of the key node of the GOA circuit during actual operation of FIG. 2.

FIG. 3 shows waveforms of the critical nodes of the GOA circuit during actual operation of FIG. 2. XCK indicates an clock signal adjacent to the (N)th level shift register unit, in other words, XCK indicates an (N+1)th level clock signal (CK(N+1).

Duty ratios of the (N)th level clock signal CK(N) and the (N+1)th level clock signal (CK(N+1) must be lower than 50 percent in order to make a wave shape of the gate signal point Q(N) be convex; the sixteenth TFT T21 is used to pull down the (N)th level scanning line G(N).

The constant voltage VDD is set at high potential the same as the clock signal CK, XCK. A storing capacity of the gate signal point Q(N) could be raised by raising the potential of the constant voltage VDD adequately.

The first direct-current voltage VSS1 and the second direct-current voltage VSS2 both are set at constant-negative potential in order to supply low potentials of a driving circuit. Generally, the first direct-current voltage VSS1 is lower than the second direct-current voltage VSS2.

Figure 4:
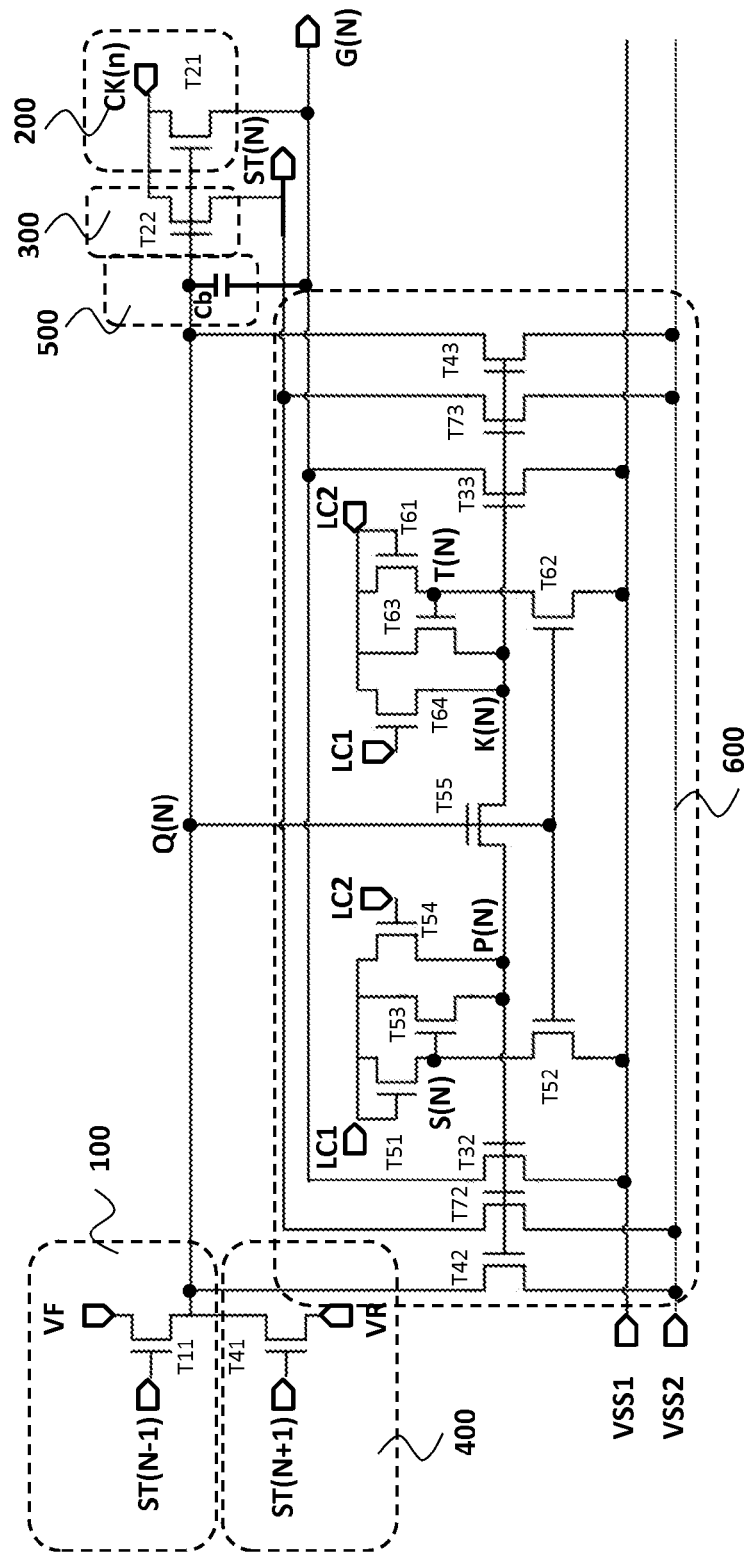
FIG. 4 is a circuit diagram of a GOA circuit of a second embodiment of the present invention.

FIG. 4 is a circuit diagram of a GOA circuit of a second embodiment of the present invention. In the second embodiment, the constant voltage VDD of the first embodiment is replaced by a forward voltage VF, the source of the seventeenth TFT T41 is connected with a backward voltage VR. In the second embodiment, forward-scanning operation and backward-scanning operation are accomplished by the forward voltage VF and the backward voltage VR.

While the forward voltage VF is at high potential and the backward voltage VR is at low potential, the circuit proceeds with the forward-scanning operation. The pull-up control circuit 100 still performs the function of the pull-up control circuit 100, the pull-down circuit 400 also still performs the function of the pull-down circuit 400 to lower the potential of the gate signal point Q(N). The operation theory is similar to the first embodiment.

While the forward voltage VF is at low potential and the backward voltage VR is at high potential, the circuit proceeds with the backward-scanning operation. The pull-down circuit 400 performs the function of the pull-up control circuit 100, the pull-up control circuit 100 performs the function of the pull-down circuit 400 to lower the potential of the gate signal point Q(N); in other words, during the backward-scanning operation, the pull-up control circuit 100 and the pull-down circuit 400 perform different functions from those in the forward-scanning operation.

As stated above, by controlling the forward voltage VF and the backward voltage VR, the forward-scanning operation and the backward-scanning operation of the circuit are accomplished.

Figure 5:
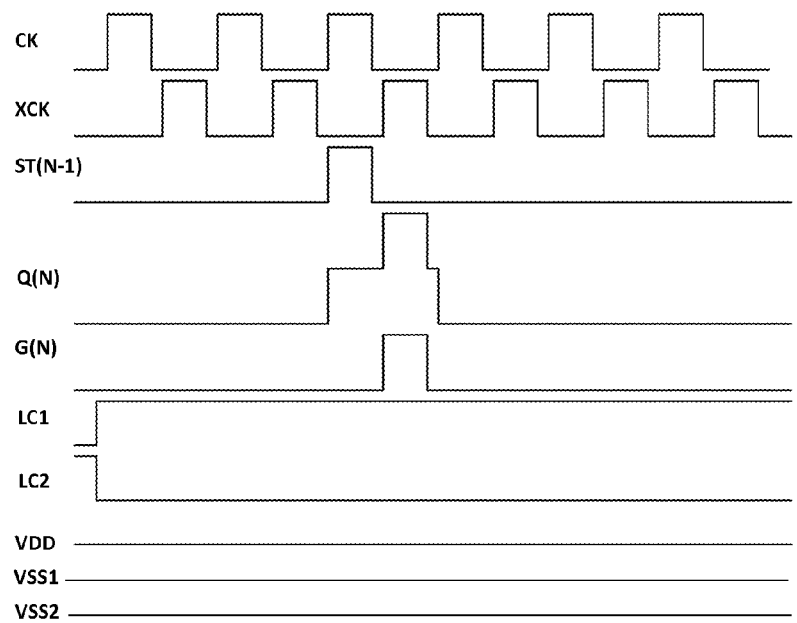
FIG. 5 is a pulse diagram of the key node of the GOA circuit during forward-scanning operation of FIG. 4.

FIG. 5 shows waveforms of the key nodes of the GOA circuit during forward-scanning operation of FIG. 4. During the forward-scanning operation, the forward voltage VF is at high potential and the backward voltage VR is at low potential, the other signals are the same as in the first embodiment.

Duty ratios of the (N)th level clock signal CK(N) and the (N+1)th level clock signal CK(N+1) must be lower than 50 percent in order to make a waveform of the gate signal point Q(N) be convex, the sixteenth TFT T21 is used to pull down the (N)th level scanning line G(N).

The potential of the gate signal point Q(N) is proceeded a first stage raise by the start signal ST(N-1) of an (N-1)th level shift register.

Figure 6:
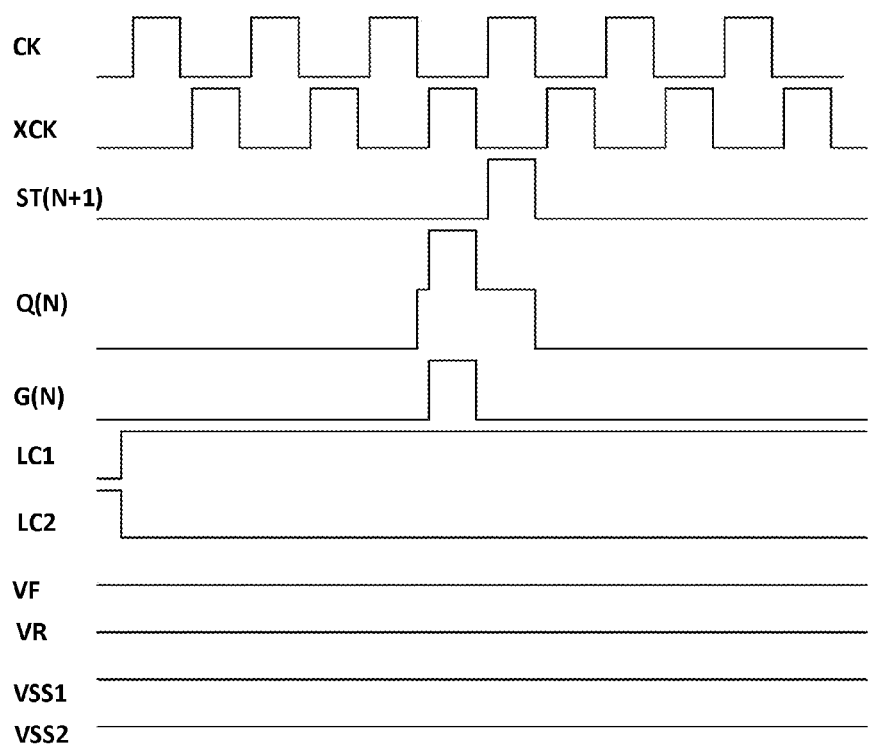
FIG. 6 is a pulse diagram of the key node of the GOA circuit during backward-scanning operation of FIG. 4.

FIG. 6 is a pulse diagram of the key node of the GOA circuit during backward-scanning operation of FIG. 4. During the backward-scanning operation, the forward voltage VF is at low potential and the backward voltage VR is at high potential. The other signals are the same as the first embodiment.

Duty ratios of the (N)th level clock signal CK(N) and the (N+1)th level clock signal CK(N+1) must be lower than 50 percent in order to make a wave shape of the gate signal point Q(N) be convex, the sixteenth TFT T21 is used to pull down the (N)th level scanning line G(N).

The potential of the gate signal point Q(N) is proceeded a first stage raise by the start signal ST(N+1) of an (N+1)th level shift register.

By using the voltages VF, VR to accomplish the forward-scanning and backward-scanning operations, the function of forward-scanning and backward-scanning of the GOA circuit is achieved.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A GOA (Gate Driver on Array) circuit applied to a liquid crystal display, comprising:
a plurality of cascaded shift register units, an (N)th level shift register unit being controlled to charge an (N)th level scanning line (G(N)) accordingly, the (N)th level shift register unit includes a pull-up circuit (200), a pull-down circuit (400), a pull-down sustain circuit (600), a pull-up control circuit (100), a down transfer circuit (300), and an bootstrap capacitor (Cb);
the pull-up circuit (200), the pull-down sustain circuit (600), and the bootstrap capacitor (Cb) being individually connected with a gate signal point Q(N) and the Nth level scanning line (G(N));
the pull-up control circuit (100) and the down transfer circuit (300) being individually connected with the gate signal point Q(N);
the pull-down circuit (400) being connected with a start signal (ST(N+1)) of an (N+1)th level shift register;
the pull-up control circuit (100 being connected with a start signal (ST(N−1)) of an (N−1)th level shift register;
the pull-down sustain circuit (600) comprises:
a first TFT (Thin film transistor) (T32) comprises a gate of the first TFT (T32) being connected with a first circuit point (P(N)), a drain of the first TFT (T32) being connected with the (N)th level scanning line (G(N)), and a source of the first TFT (T32) being connected with a first direct-current voltage (VSS1);
a second TFT (T42), a gate of the second TFT (T42) being connected with the first circuit point ((P(N)), a drain of the second TFT (T42) being connected with the gate signal point (Q(N)), and a source of the second TFT (T42) being connected with a second direct-current voltage (VSS2);
a third TFT (T52), a gate of the third TFT (T52) being connected with the gate signal point (Q(N)), a drain of the third TFT (T52) being connected with a source signal point (S(N)), and a source of the third TFT (T52) being connected with the first direct-current voltage (VSS1);
a fourth TFT (T51), and a source of the fourth TFT (T51) being connected with a source signal point (S(N)), a gate and a drain of the fourth TFT (T51) being connected with a first clock signal (LC1);
a fifth TFT (T53), a gate of the fifth TFT (T53) being connected with the source signal point (S(N)), a drain of the fifth TFT (T53) being connected with the first clock signal (LC1), and a source of the fifth TFT (T53) being connected with the first circuit point (P(N));
a sixth TFT (T54), a gate of the sixth TFT (T54) being connected with a second clock signal (LC2), a drain of the sixth TFT (T54) being connected with the first clock signal (LC1), and a source of the sixth TFT (T54) being connected with the first circuit point (P(N));
a seventh TFT (T72), a gate of the seventh TFT (T72) being connected with the first circuit point (P(N)), a drain of the seventh TFT (T72) being connected with a start signal (ST(N)) of an (N)th level shift register, and a source of the seventh TFT (T72) being connected with the second direct-current voltage (VSS2);
an eighth TFT (T33), a gate of the eighth TFT (T33) being connected with a second circuit point (K(N)), a drain of the eighth TFT (T33) being connected with the (N)th level scanning line (G(N)), and a source of the eighth TFT (T33) being connected with the first direct-current voltage (VSS1);
a ninth TFT (T43), a gate of the ninth TFT (T43) being connected with the second circuit point (K(N)), a drain of the ninth TFT (T43) being connected with the gate signal point (Q(N)), and a source of the ninth TFT (T43) being connected with the second direct-current voltage (VSS2);
a tenth TFT (T62), a gate of the tenth TFT (T62) being connected with the gate signal point (Q(N)), a drain of the tenth TFT (T62) being connected with a drain signal point (T(N)), and a source of the tenth TFT (T62) being connected with the first direct-current voltage (VSS1);
an eleventh TFT (T61), and a source of the eleventh TFT (T61) being connected with the drain signal point (T(N)), a gate and a drain of the eleventh TFT (T61) being connected with the second clock signal (LC2);
a twelfth TFT (T63), a gate of the twelfth TFT (T63) being connected with the drain signal point (T(N)), a drain of the twelfth TFT (T63) being connected with the second clock signal (LC2), and a source of the twelfth TFT (T63) being connected with the second circuit point (K(N));
a thirteenth TFT (T64), a gate of the thirteenth TFT (T64) being connected with the first clock signal (LC1), a drain of the thirteenth TFT (T64) being connected with the second clock signal (LC2), and a source of the thirteenth TFT (T64) being connected with the second circuit point (K(N));
a fourteenth TFT (T73), a gate of the fourteenth TFT (T73) being connected with the second circuit point (K(N)), a drain of the fourteenth TFT (T73) being connected with the start signal (ST(N)) of an (N)th level shift register, and a source of the fourteenth TFT (T73) being connected with the second direct-current voltage (VSS2); and
a fifteenth TFT (T55), a gate of the fifteenth TFT (T55) being connected with the gate signal point (Q(N)), a drain of the fifteenth TFT (T55) being connected with the first circuit point (P(N)), and a source of the fifteenth TFT (T55) being connected with the second circuit point (K(N));
while in operation, frequencies of the first clock signal (LC1) and the second clock signal (LC2) are lower than that of an (N) level clock signal (CK(N)), a process of charging the first circuit point (P(N)) by the first clock signal (LC1) and a process of charging the second circuit point (K(N)) by the second clock signal (LC2) are performed alternatingly, wherein the pull-up circuit (200) comprises a sixteenth TFT (T21), a gate of the sixteenth TFT (T21) being connected with the gate signal point (Q(N)), a drain of the sixteenth TFT (T21) being connected with the (N) level clock signal (CK (N)), and a source of the sixteenth TFT (T21) being connected with the (N)th level scanning line (G(N)).

2. The GOA circuit applied to a liquid crystal display according to claim 1, wherein the pull-down circuit (400) comprises:
a seventeenth TFT (T41), a gate of the seventeenth TFT (T41) being connected with the start signal (ST(N+1)) of an (N+1)th level shift register, a drain of the seventeenth TFT (T41) being connected with the gate signal point Q(N), and a source of the seventeenth TFT (T41) being connected with the second direct-current voltage (VSS2).

3. The GOA circuit applied to a liquid crystal display according to claim 1, wherein the down transfer circuit (300) comprises:
an eighteenth TFT (T22), a gate of the eighteenth TFT (T22) being connected with the gate signal point Q(N), a drain of the eighteenth TFT (T22) being connected with the (N) level clock signal (CK(N)), and a source of the eighteenth TFT (T22) being connected with the start signal (ST(N)) of an (N)th level shift register.

4. The GOA circuit applied to a liquid crystal display according to claim 1, wherein the pull-up control circuit (100) comprises:
an nineteenth TFT (T11), a gate of the nineteenth TFT (T11) being connected with the start signal (ST(N−1)) of an (N−1)th level shift register, a drain of the nineteenth TFT (T11) being connected with a constant voltage (VDD), and a source of the nineteenth TFT (T11) being connected with the gate signal point Q(N).

5. The GOA circuit applied to a liquid crystal display according to claim 1, wherein the pull-up control circuit (100) comprises:
an nineteenth TFT (T11), a gate of the nineteenth TFT (T11) being connected with the start signal (ST(N−1)) of an (N−1)th level shift register, a drain of the nineteenth TFT (T11) being connected with a forward voltage (VF), and a source of the nineteenth TFT (T11) being connected with the gate signal point Q(N).

6. The GOA circuit applied to a liquid crystal display according to claim 5, wherein the pull-down circuit (400) comprises:
a seventeenth TFT (T41), a gate of the seventeenth TFT (T41) being connected with the start signal (ST(N+1)) of an (N+1)th level shift register, a drain of the seventeenth TFT (T41) being connected with the gate signal point Q(N), and a source of the seventeenth TFT (T41) being connected with a backward voltage (VR).

7. The GOA circuit applied to a liquid crystal display according to claim 1, wherein a duty ration of the (N) level clock signal (CK(N)) is less than 50 percent.

8. The GOA circuit applied to a liquid crystal display according to claim 1, wherein the second direct-current voltage (VSS2) is less than the first direct-current voltage (VSS1).

9. A display device, wherein the display device comprises the GOA circuit applied to a liquid crystal display mentioned in claim 1.

10. A GOA circuit applied to a liquid crystal display, comprising:
a plurality of cascaded shift register units, an (N)th level shift register unit being controlled to charge an (N)th level scanning line (G(N)) accordingly, the (N)th level shift register unit includes a pull-up circuit (200), a pull-down circuit (400), a pull-down sustain circuit (600), a pull-up control circuit (100), a down transfer circuit (300), and an bootstrap capacitor (Cb);
the pull-up circuit (200), the pull-down sustain circuit (600), and the bootstrap capacitor (Cb) being individually connected with a gate signal point Q(N) and the Nth level scanning line (G(N));
the pull-up control circuit (100) and the down transfer circuit (300) being individually connected with the gate signal point Q(N);
the pull-down circuit (400) being connected with a start signal (ST(N+1)) of an (N+1)th level shift register;
the pull-up control circuit 100 being connected with a start signal (ST(N−1)) of an (N−1)th level shift register;
the pull-down sustain circuit (600) comprises:
a first TFT (Thin film transistor) (T32), a gate of the first TFT (T32) being connected with a first circuit point (P(N)), a drain of the first TFT (T32) being connected with the (N)th level scanning line (G(N)), and a source of the first TFT (T32) being connected with a first direct-current voltage (VSS1);
a second TFT (T42), a gate of the second TFT (T42) being connected with the first circuit point ((P(N)), a drain of the second TFT (T42) being connected with the gate signal point (Q(N)), and a source of the second TFT (T42) being connected with a second direct-current voltage (VSS2);
a third TFT (T52), a gate of the third TFT (T52) being connected with the gate signal point (Q(N)), a drain of the third TFT (T52) being connected with a source signal point (S(N)), and a source of the third TFT (T52) being connected with the first direct-current voltage (VSS1);
a fourth TFT (T51), and a source of the fourth TFT (T51) being connected with a source signal point (S(N)), a gate and a drain of the fourth TFT (T51) being connected with a first clock signal (LC1);
a fifth TFT (T53), a gate of the fifth TFT (T53) being connected with the source signal point (S(N)), a drain of the fifth TFT (T53) being connected with the first clock signal (LC1), and a source of the fifth TFT (T53) being connected with the first circuit point (P(N));
a sixth TFT (T54), a gate of the sixth TFT (T54) being connected with a second clock signal (LC2), a drain of the sixth TFT (T54) being connected with the first clock signal (LC1), and a source of the sixth TFT (T54) being connected with the first circuit point (P(N));
a seventh TFT (T72), a gate of the seventh TFT (T72) being connected with the first circuit point (P(N)), a drain of the seventh TFT (T72) being connected with a start signal (ST(N)) of an (N)th level shift register, and a source of the seventh TFT (T72) being connected with the second direct-current voltage (VSS2);
an eighth TFT (T33), a gate of the eighth TFT (T33) being connected with a second circuit point (K(N)), a drain of the eighth TFT (T33) being connected with the (N)th level scanning line (G(N)), and a source of the eighth TFT (T33) being connected with the first direct-current voltage (VSS1);
a ninth TFT (T43), a gate of the ninth TFT (T43) being connected with the second circuit point (K(N)), a drain of the ninth TFT (T43) being connected with the gate signal point (Q(N)), and a source of the ninth TFT (T43) being connected with the second direct-current voltage (VSS2);
a tenth TFT (T62), a gate of the tenth TFT (T62) being connected with the gate signal point (Q(N)), a drain of the tenth TFT (T62) being connected with a drain signal point (T(N)), and a source of the tenth TFT (T62) being connected with the first direct-current voltage (VSS1);
an eleventh TFT (T61), and a source of the eleventh TFT (T61) being connected with the drain signal point (T(N)), a gate and a drain of the eleventh TFT (T61) being connected with the second clock signal (LC2);

a twelfth TFT (T63), a gate of the twelfth TFT (T63) being connected with the drain signal point (T(N)), a drain of the twelfth TFT (T63) being connected with the second clock signal (LC2), and a source of the twelfth TFT (T63) being connected with the second circuit point (K(N));

a thirteenth TFT (T64), a gate of the thirteenth TFT (T64) being connected with the first clock signal (LC1), a drain of the thirteenth TFT (T64) being connected with the second clock signal (LC2), and a source of the thirteenth TFT (T64) being connected with the second circuit point (K(N));

a fourteenth TFT (T73), a gate of the fourteenth TFT (T73) being connected with the second circuit point (K(N)), a drain of the fourteenth TFT (T73) being connected with the start signal (ST(N)) of an (N)th level shift register, and a source of the fourteenth TFT (T73) being connected with the second direct-current voltage (VSS2); and a fifteenth TFT (T55), a gate of the fifteenth TFT (T55) being connected with the gate signal point (Q(N)), a drain of the fifteenth TFT (T55) being connected with the first circuit point (P(N)), and a source of the fifteenth TFT (T55) being connected with the second circuit point (K(N));

while in operation, frequencies of the first clock signal (LC1) and the second clock signal (LC2) are lower than that of an (N) level clock signal (CK(N)), a process of charging the first circuit point (P(N)) by the first clock signal (LC1) and a process of charging the second circuit point (K(N)) by the second clock signal (LC2) are performed alternatingly.

11. The GOA circuit applied to a liquid crystal display according to claim 10, wherein the pull-up circuit (200) comprises:

a sixteenth TFT (T21), a gate of the sixteenth TFT (T21) being connected with the gate signal point (Q(N)), a drain of the sixteenth TFT (T21) being connected with the (N) level clock signal (CK(N)), and a source of the sixteenth TFT (T21) being connected with the (N)th level scanning line (G(N)).

12. The GOA circuit applied to a liquid crystal display according to claim 10, wherein the pull-down circuit (400) comprises:

a seventeenth TFT (T41), a gate of the seventeenth TFT (T41) being connected with the start signal (ST(N+1)) of an (N+1)th level shift register, a drain of the seventeenth TFT (T41) being connected with the gate signal point Q(N), and a source of the seventeenth TFT (T41) being connected with the second direct-current voltage (VSS2).

13. The GOA circuit applied to a liquid crystal display according to claim 10, wherein the down transfer circuit (300) comprises:

an eighteenth TFT (T22), a gate of the eighteenth TFT (T22) being connected with the gate signal point Q(N), a drain of the eighteenth TFT (T22) being connected with the (N) level clock signal (CK(N)), and a source of the eighteenth TFT (T22) being connected with the start signal (ST(N)) of an (N)th level shift register.

14. The GOA circuit applied to a liquid crystal display according to claim 10, wherein the pull-up control circuit (100) comprises:

an nineteenth TFT (T11), a gate of the nineteenth TFT (T11) being connected with the start signal (ST(N−1)) of an (N−1)th level shift register, a drain of the nineteenth TFT (T11) being connected with a constant voltage (VDD), and a source of the nineteenth TFT (T11) being connected with the gate signal point Q(N).

15. The GOA circuit applied to a liquid crystal display according to claim 10, wherein the pull-up control circuit (100) comprises:

an nineteenth TFT (T11), a gate of the nineteenth TFT (T11) being connected with the start signal (ST(N−1)) of an (N−1)th level shift register, a drain of the nineteenth TFT (T11) being connected with a forward voltage (VF), and a source of the nineteenth TFT (T11) being connected with the gate signal point Q(N).

16. The GOA circuit applied to a liquid crystal display according to claim 15, wherein the pull-down circuit (400) comprises:

a seventeenth TFT (T41), a gate of the seventeenth TFT (T41) being connected with the start signal (ST(N+1)) of an (N+1)th level shift register, a drain of the seventeenth TFT (T41) being connected with the gate signal point Q(N), and a source of the seventeenth TFT (T41) being connected with a backward voltage (VR).

17. The GOA circuit applied to a liquid crystal display according to claim 10, wherein a duty ration of the (N) level clock signal (CK(N)) is less than 50 percent.

18. The GOA circuit applied to a liquid crystal display according to claim 10, wherein the second direct-current voltage (VSS2) is less than the first direct-current voltage (VSS1).

* * * * *